(12) United States Patent
Ikemura

(10) Patent No.: US 6,248,454 B1
(45) Date of Patent: Jun. 19, 2001

(54) EPOXY RESIN COMPOSITION FOR SEMICONDUCTOR ENCAPSULATION AND SEMICONDUCTOR DEVICE

(75) Inventor: Kazuhiro Ikemura, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/409,692

(22) Filed: Sep. 30, 1999

(30) Foreign Application Priority Data

Dec. 8, 1998 (JP) .................................................. 10-349112
Sep. 2, 1999 (JP) .................................................. 11-248523

(51) Int. Cl.$^7$ .................................................... H01L 29/12
(52) U.S. Cl. ........................................... 428/620; 523/211
(58) Field of Search ............................... 523/211; 428/620

(56) References Cited

U.S. PATENT DOCUMENTS 5,294,835 * 3/1994 Igarashi et al. ....................... 257/793

FOREIGN PATENT DOCUMENTS

08301978 * 5/1995 (JP) .
8-301978 11/1996 (JP) .

* cited by examiner

Primary Examiner—Robert Dawson
Assistant Examiner—D. Aylward
(74) Attorney, Agent, or Firm—Sughrue, Mion, Zinn, Macpeak & Seas, PLLC

(57) ABSTRACT

An epoxy resin composition for semiconductor encpsulation, which is excellent in both storage stability and rapid curability, is disclosed. The epoxy resin composition for semiconductor encapsultion comprises (A) an epoxy resin, (B) a phenolic resin, and a combination of (C) a cure accelerator and (D) cure accelerator-containing microcapsules having a core/shell structure in which a cure accelerator as a core is encapsulated in a thermoplastic resin shell.

12 Claims, No Drawings

EPOXY RESIN COMPOSITION FOR SEMICONDUCTOR ENCAPSULATION AND SEMICONDUCTOR DEVICE

FIELD OF THE INVENTION

This invention relates to an epoxy resin composition for semiconductor encapsulation, which is excellent in curability and storage stability, and to a semiconductor device encapsulated with the epoxy resin composition.

BACKGROUND OF THE INVENTION

In the field of semiconductor elements, such as transistors, IC chips, and LSI chips, plastic packages have now prevailed from the standpoint of cost and suitability to mass production. Epoxy resin composition have been of wide use as an encapsulating resin, achieving satisfactory results. In particular, an epoxy resin composition comprising an epoxy resin, a novolak phenolic resin as a hardener, a cure accelerator, and an inorganic filler such as silica powder has been made frequent use of for its excellent encapsulating properties.

In recent years, the competition for the cost of plastic packages has been heated up. As an approach to cost reduction, efforts have been made to reduce a molding cycle thereby to improve production efficiency. With this tendency, the demand for an encapsulating material with improved curing properties has been increasing, which has been met by increasing the amount of a cure accelerator to be added.

An epoxy resin composition previously added with a cure accelerator undergoes curing reaction while stored. In particular where added with a large quantity of a cure accelerator, the composition undergoes rapid reaction before use, having an extremely short pot life and reducing the working efficiency. Therefore, it has recently been proposed to use an epoxy resin composition containing microcapsules of a cure accelerator.

While excellent in storage stability, the epoxy resin composition containing encapsulated cure accelerator as a sole cure accelerating component has the following drawback. Because of the microcapsule shell to be melted and destroyed, a delay is produced in allowing the cure accelerator to act in molding the resin composition for semiconductor encapsulation. As a result, the composition is inferior in rapid curability. The disadvantage is particularly conspicuous when the molding temperature is low (usually 140 to 180° C.).

SUMMARY OF THE INVENTION

In the light of the above-mentioned circumstances, one object of the invention is to provide an epoxy resin composition for semiconductor encapsulation, which is excellent in both storage stability and rapid curability.

Another object of the present invention is to provide a semiconductor device using the epoxy resin composition.

To accomplish the above objects, the invention provides in its first embodiment an epoxy resin composition for semiconductor encapsulation, which comprises:

(A) an epoxy resin,
(B) a phenol resin,
(C) a cure accelerator, and
(D) cure accelerator-containing microcapsules having a core/shell structure in which a cure accelerator as a core is encapsulated in a shell comprising a thermoplastic resin.

The invention also provides, in its second embodiment, a semiconductor device comprising a semiconductor element encapsulated with the above-described epoxy resin composition.

The inventor of the present invention has conducted a series of studies for the purpose of solving the problems associated with conventional epoxy resin compositions for semiconductor encapsulation. In order to satisfy the requirements for storage stability and rapid curability, which are conflicting with each other, the inventor has focused his study on compounding additives. As a result, he has found that a combined use of a cure accelerator and an encapsulated cure accelerator, i.e., cure accelerator-containing microcapsules, affords an encapsulating material satisfying both the requirements and thus completed the present invention.

In a preferred embodiment, the mixing ratio of the cure accelerator and the cure accelerator-containing microcapsules is specified to secure the improvements in rapid curability and storage stability.

In another preferred embodiment, the shell of the cure accelerator-containing microcapsules comprises polyurea prepared by using specific triisocyanate compounds at a specific mixing ratio. According to this embodiment, because the destruction temperature of the shell can be controlled suitably, it is possible to melt-knead the microcapsules with other components at high temperatures around 130° C. This means that the kneading system will have a reduced viscosity, which is advantageous for achieving thorough kneading, to give an epoxy resin composition having the components dispersed uniformly.

In still another preferred embodiment, a biphenyl type epoxy resin is used as the epoxy resin so that the epoxy resin composition exhibits improved flowability, i.e., improved moldability.

In yet another preferred embodiment, a phenol aralkyl resin is used as the phenolic resin. In this case, the epoxy resin composition exhibits improved flowability and provides a cured product with reduced hygroscopicity and reduced elastic modulus in favor of soldering resistance and the like.

DETAILED DESCRIPTION OF THE INVENTION

The present invention is described in detail below.

The epoxy resin composition for semiconductor encapsulation according to the invention is obtained from (A) an epoxy resin, (B) a phenolic resin, (C) a cure accelerator, and (D) specific cure accelerator-containing microcapsules. The epoxy resin composition of the invention is usually supplied in the form of powder or tablets of powder.

The epoxy resin as component (A) is not particularly limited and includes various types that have been commonly used as a semiconductor encapsulating resin, such as a bisphenol A type epoxy resin, a novolak type epoxy resin synthesized from various phenols. These epoxy resins can be used either individually or a mixture of two or more thereof. Of the epoxy resins preferred are those which are solid at room temperature, having a melting point exceeding room temperature. Generally useful epoxy resins include biphenyl type epoxy resins and novolak epoxy resins. Of the novolak epoxy resins, those having an epoxy equivalent of 160 to 250 and a softening point of 50 to 130° C. are suitable. The biphenyl type epoxy resins include those represented by formula (IV):

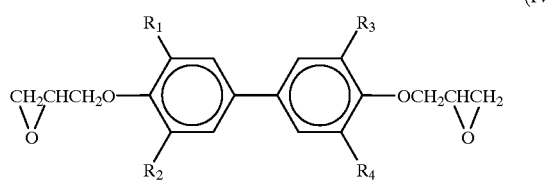

(IV)

wherein $R_1$, $R_2$, $R_3$, and $R_1$, which may be the same or different, each represent a hydrogen atom or an alkyl group having 1 to 4 carbon atoms.

In formula (IV), the alkyl group includes straight-chain or branched lower alkyl groups, such as methyl, ethyl, n-propyl, isopropyl, n-butyl, isobutyl, sec-butyl, and t-butyl groups. From the standpoint of low hygroscopicity and reactivity, it is preferred to use a 1:1 (by weight) mixture of a biphenyl type epoxy resin in which all of $R_1$, $R_2$, $R_3$, $R_4$ represent a methyl group and a biphenyl type epoxy resin in which all of $R_1$, $R_2$, $R_3$, $R_4$ represent a hydrogen atom.

The phenolic resin as component (B), which acts as a hardener for the epoxy resin, includes novolak type phenolic resins, such as phenol novolak resins, cresol novolak resins, t-butylphenol novolak resins, and nonylphenol novolak resins; resole type phenolic resins; phenol aralkyl resins; and polyhydroxystyrene, such as poly-p-hydroxystyrene. They can be used either individually or as a mixture of two or more thereof. Preferred of them are novolak type phenolic resins and phenol aralkyl resins. The novolak type phenolic resins preferably have a softening point of 50 to 110° C. and a hydroxyl equivalent of 100 to 150. The phenol aralkyl resins include those represented by formula (V):

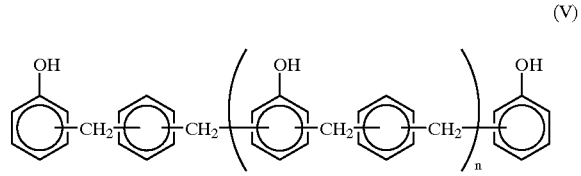

(V)

wherein n represents 0 or a positive integer.

In the above formula (V) n is preferably 0 or a positive integer of 1 to 40, and more preferably 0 or a positive integer of 1 to 30.

It is preferred for the phenol aralkyl resin represented by formula (V) to have a hydroxyl equivalent of 150 to 220, particularly 150 to 200, and a softening point of 40 to 110° C., particularly 50 to 90° C.

The phenolic resin as component (B) is preferably used in such an amount that the hydroxyl equivalent of the phenolic resin is 0.5 to 2.0, preferably 0.8 to 1.2, per epoxy equivalent of the epoxy resin as component (A). Out of the preferred range, the composition tends to fail to undergo sufficient hardening, and the resulting cured resin tends to suffer from deterioration of characteristics.

The cure accelerator which can be used as component (C) is not particularly limited. Any known cure accelerators for epoxy resins, such as tertiary amines, imidazole compounds, quaternary ammonium salts, organometallic salts, phosphorus compounds (e.g., triphenylphosphine and tetraphenylphosphonium tetraphenylborate), diazabicycloalkenes (e.g., 1,8-diazabicyclo[5.4.0]undecene-7), and derivatives of these compounds, can be used. The cure accelerators can be added either individually or as a combination thereof of two or more thereof. Preferred among the above-mentioned cure accelerators are the phosphorus compounds and 1,8-diazabicyclo[5.4.0]undene-7.

The cure accelerator-containing microcapsules which can be used as component (D) are microcapsules having a core/shell structure in which a core comprising a cure accelerator is encapsulated in an outer shell comprising a thermoplastic resin.

Well-known cure accelerators can be used as a core with no particular limitation. Those which are liquid at ambient temperature are suitable from the viewpoint of workability in microencapsulation or the characteristics of the resulting microcapsules. The language "liquid at ambient temperature" means that the cure accelerator is liquid in itself at ambient temperature or the cure accelerator is solid at ambient temperature but can be liquefied by dissolving or dispersing in an appropriate organic solvent.

The cure accelerator to be encapsulated includes amines, imidazole compounds, phosphorous compounds, boron compounds, and phosphorus-boron compounds. Examples of suitable cure accelerators are substituted guanidines, such as ethylguanidine, trimethylguanidine, phenylguanidine, and diphenylguanidine; 3-(substituted or unsubstituted phenyl)-1,1-dimethylureas, such as 3-(3,4-dichlorophenyl)-1,1-dimethylurea, 3-phenyl-1,1-dimethylurea, and 3-(4-chlorophenyl)-1,1-dimethylurea; imidazoline derivatives, such as 2-methylimidazoline, 2-phenylimidazoline, 2-undecylimidazoline, and 2-heptadecylimidazoline; monoaminopyridines, such as 2-aminopyridine; amineimides, such as N,N-dimethyl-N-(2-hydroxy-3-allyloxypropyl)amine-N'-lactamide; organophosphorus compounds, such as ethylphosphine, propylphosphine, butylphosphine, phenylphosphine, trimethylphosphine, triethylphosphine, tributylphosphine, trioctylphosphine, triphenylphosphine, tricyclohexylphosphine, triphenylphosphine/triphenylborane complex, and tetraphenylphosphonium tetraphenylborate; and diazabicycloalkenes, such as 1,8-diazabicyclo[5.4.0] undecene-7 and 1,5-diazabicyclo[4.3.0]nonene-5. They can be used either individually or as a combination of two or more thereof In particular, the organophosphorus compounds are preferred for the ease in encapsulation and handling.

Any organic solvent that is liquid at ambient temperature can be incorporated into the shell unless it dissolves the shell. Useful organic solvents include ethyl acetate, methyl ethyl ketone, acetone, methylene chloride, xylene, toluene, tetrahydrofuran, and so-called oils, such as phenylxylylethane and dialkylnaphthalenes.

Various thermoplastic resins can be used as a shell with no particular limitation. Polyurea is particularly preferred. Useful polyurea includes one prepared from a triisocyanate compound represented by formula (I) and a triisocyanate compound represented by formula (I):

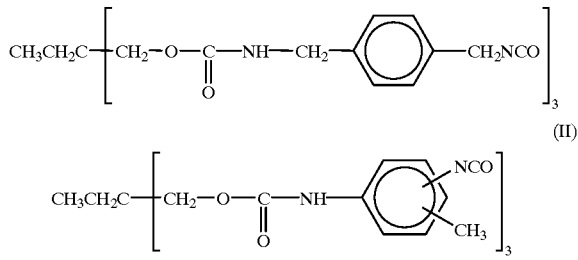

(I)

(II)

The compound of formula (I) (hereinafter referred to as compound (I)) can be easily prepared by, for example, addition reaction of 1 mole of trimethylolpropane and 3 moles of xylylene diisocyanate in ethyl acetate.

The compound of formula (II) (hereinafter referred to as compound (II)) can be easily prepared by, for example, addition reaction of 1 mole of trimethylolpropane and 3 moles of 2,4-tolylene diisocyanate in ethyl acetate. The reaction can be carried out in the presence of a small amount of a tin type catalyst for urethanation.

Of the compounds (II) those represented by formula (IIa) are usually used.

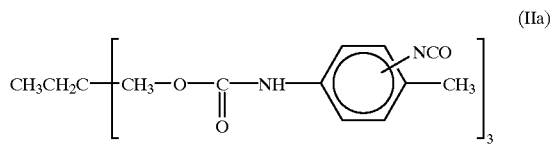

(IIa)

The compound (I) and the compound (II) are preferably used at a (I)/(II) molar ratio of 100/0 to 30/70, preferably 70/30 to 50/50. Where the molar ratio of the compound (I) is below 30 (the molar ratio of the compound (II) is above 70), the destruction initiation temperature of the shell is as high as 165° C. or even higher, and the epoxy resin composition tends to exhibit reduced curability on packaging a semiconductor element. By setting the (I)/(II) molar ratio as to fall within the preferred range, the destruction temperature of the shell can be set within a favorable range of from 150° C.±15° C. In particular, with the (I)/(II) molar ratio ranging from 70/30 to 50/50, the destruction temperature of the shell will be set around 150 to 160° C. This makes it feasible to mix up components (A) to (D) in a molten state at high temperature about 130° C., which has been difficult in preparing a conventional epoxy resin composition containing cure accelerator-containing microcapsules. That is, the viscosity and the shear of the kneading system are reduced, and kneading can be performed thoroughly. It follows that the resulting epoxy resin composition has the components, especially an inorganic filler which is usually incorporated as an additive (hereinafter described), dispersed uniformly.

It is preferred for the polyurea prepared from a mixture of the compound (I) and the compound (II) (hereinafter referred to as polyurea A) to mainly comprise a repeating unit represented by formula (III):

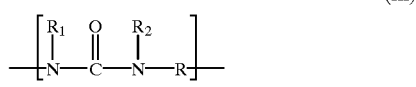

(III)

wherein R represents a divalent organic group; and $R_1$ and $R_2$, which may be the same or different, each represent a hydrogen atom or a monovalent organic group, preferably a hydrogen atom.

Polyurea A mainly comprising the repeating unit of formula (III) is obtained by, for example, allowing the mixture of the triisocyanate compounds (I) and (II) to react with water. The mixture of the compounds (I) and (II) is hydrolyzed to give an amine compound, which reacts with unreacted isocyanate groups (so-called self polyaddition) to form polyurea A.

Polyurea A is also obtainable by polyaddition reaction between the mixture of compounds (I) and (II) and a polyamine. Any polyamine having two or more amino groups can be used. Examples of suitable polyamines are diethylenetriamine, triethylenetetramine, tetraethylenepentamine, 1,6-hexamethylenediamine, 1,8-octamethylenediamine, 1,12-dodecamethylene-diamine, o-phenylenediamine, m-phenylenediamine, p-phenylenediamine, o-xylylenediamine, m-xylylenediamine, p-xylylenediamine, menthanediamine, bis(4-amino-3-methylcyclohexyl)methane, isophoronediamine, 1,3-diaminocyclohexane, and spiro-acetal diamines. They can be used either individually or as a combination of two or more thereof. Preferred of them are diethylenetriamine, triethylenetetramine, and tetraethylenepentamine for the isolating or protecting ability of the formed shell.

The cure accelerator-containing microcapsules as component (D) can be prepared by various known microencapsulation methods. An interfacial polymerization method is particularly preferred for forming a shell of uniform quality and a controlled thickness.

Interfacial polymerization for the preparation of cure accelerator-containing microcapsules is performed as follows. In case of using a cure accelerator that is liquid itself, a mixture of the compounds (I) and (II) is dissolved in the cure accelerator, and the resulting oily solution is dispersed in an aqueous phase to prepare an O/W emulsion. It is preferred for the stability of the emulsion during polymerization that the dispersed oil droplets have a particle size of about 0.05 to 50 µm, preferably about 0.05 to 20 µm.

Where a solid cure accelerator is used as dissolved in an organic solvent, there is obtained an S/O/W (solid phase/oily phase/aqueous phase) emulsion. This is the case with lipophilic cure accelerators. In case where the solid cure accelerator is hydrophilic, on the other hand, it may be difficult to prepare an S/O/W emulsion. In that case, interfacial polymerization can be carried out in an O/O emulsion or an S/O/O emulsion that is prepared by solubility adjustment.

A polyamine or a polyhydric alcohol is added to the aqueous phase of the emulsion to cause polyaddition in the interface between the polyamine or polyhydric alcohol and the mixed isocyanate compounds dissolved in the oily phase to form a shell of polyurea A in which the cure accelerator is incorporated as a core.

The cure accelerator-containing microcapsules thus obtained as component (D) can be isolated by well-known means, such as centrifugation followed by drying or spray-drying. Component (D) can be dissolved in the epoxy resin as component (A) or the phenol resin as component (B). If desired, the organic solvent in the microcapsules can be removed by, for example, vacuum drying.

Taking into consideration the shear imposed to the microcapsules in compounding the epoxy resin composition, it is preferred for the stability and dispersibility of the microcapsules that the microcapsules have an average particle size of 0.05 to 20 µm, preferably 0.1 to 4 µm. The microcapsules are desirably spherical but may be elliptic. Where the microcapsules are not truly spherical but elliptic, flat or something, i.e., where they are irregular in particle size, an arithmetic mean of breadth and length of particles is taken as an average particle size.

A preferred proportion of the encapsulated cure accelerator in component (D) is 5 to 70% by weight, particularly 10 to 50% by weight. If it is less than 5% by weight, the reactivity tends to be so low that curing may take too much time. If it exceeds 70% by weight, the shell is so thin that the microcapsules may have insufficient strength enough to isolate the cure accelerator from the other components.

The ratio of the thickness of the shell to the particle size of the microcapsules is preferably 3 to 25%, still preferably 5 to 25%. If it is less than 3%, the microcapsules tend to fail to have sufficient mechanical strength against the shear imposed thereon in the preparation of the epoxy resin composition. If the thickness ratio exceeds 25%, release of the cure accelerator tends to be insufficient.

A mixing ratio of the cure accelerator as component (C) to the cure accelerator-containing microcapsules as component (D) preferably ranges from 95/5 to 1/99, more preferably from 20/80 to 3/97, by weight. With the (C)/(D) mixing ratio falling within the preferred range, the storage stability and rapid curability can further be improved.

The total amount of components (C) and (D) is preferably 0.5 to 6 parts by weight (hereinafter referred to as "parts"), more preferably 1.0 to 4.5 parts, by weight per 100 parts of the total amount of components (A) and (B). If the total amount of components (C) and (D) is less than 0.5 part, the epoxy resin composition tends to exhibit seriously reduced curability in encapsulating a semiconductor element only to provide an unsatisfactory semiconductor device. If it exceeds 6 parts, the composition cures so rapidly in molding for semiconductor encapsulation that the viscosity may increase before the composition covers the semiconductor element completely, tending to provide an unsatisfactory semiconductor device suffering from non-filling, wire sweep or die pad deformation.

Suitable combinations of components (C) and (D) include a combination of component (C) selected from triphenylphosphine, tetraphenylphosphonium tetraphenylborate, and 1,8-diazabicyclo[5.4.0]undecene-7 and component (D) selected from triphenylphosphine and tetraphenylphosphonium tetraphenylborate.

The epoxy resin composition comprising components (A) to (D) can further comprise (E) an inorganic filler in conformity to the use. Useful inorganic fillers as component (E) include silica, clay, gypsum, calcium carbonate, barium sulfate, alumina, beryllium oxide, silicon carbide, and silicon nitride. Silica, especially fused silica, is particularly preferred. The average particle size of the inorganic filler is preferably 0.1 to 80 µm. The inorganic filler is preferably used in an amount of 70 to 95% by weight, preferably 80 to 95% by weight, based on the total epoxy resin composition.

In addition to components (A) to (E), the epoxy resin composition can, if desired, further comprise other compounding additives, such as flame retarders and waxes. Examples of useful flame retarders include novolak type brominated epoxy resins, brominated bisphenol A epoxy resins, antimony trioxide, antimony pentoxide, and mixtures thereof Examples of useful waxes are higher fatty acids, higher fatty acid esters, higher fatty acid calcium salts, and mixtures thereof.

Additionally, silicone oil, silicone rubber, synthetic rubber, etc., can be incorporated into the epoxy resin composition for the purpose of stress reduction, or an ion scavenger, such as hydrotalcite and bismuth hydroxide, can be added for the purpose of improving reliability in a moisture resistance reliability test.

The epoxy resin composition of the invention can be prepared, for example, as follows. First of all, cure accelerator-containing microcapsules as component (D) are prepared by interfacial polymerization as described previously. Then, the essential components (A) to (D), the optional component (E), and other necessary additives are mixed up all at once and kneaded in a kneading machine, such as a mixing roll. The mixture is melt-kneaded in a hot roll or kneaded in a kneader, etc. After cooling, the mixture is ground to powder. If desired, the resulting powder is pressed into tablets.

Encapsulation of a semiconductor element with the epoxy resin composition of the invention can be performed by known molding techniques, typically low-pressure transfer molding.

Characterized by the combined use of the cure accelerator and the cure accelerator-containing microcapsules, the epoxy resin composition according to the present invention is superior in not only storage stability to conventional epoxy resin compositions containing a non-capsulated cure accelerator alone but rapid curability as compared with conventional epoxy resin compositions containing encapsulated cure accelerator alone. As a result, the semiconductor device as sealed in the epoxy resin composition of the invention has excellent reliability.

The present invention will now be illustrated in greater detail with reference to Examples and Comparative Examples, but it should be understood that the invention is not deemed to be limited thereto. Unless otherwise noted, all the percents are given by weight.

Cure accelerator-containing microcapsules (microcapsules D1 to D5) used in Examples and Comparative Examples were prepared as follows.

Microcapsules D1:

A uniform oily phase was prepared by mixing 10.5 parts of the compound (I), 6.6 parts of the compound (IIa), 6.7 parts of triphenylphosphine (cure accelerator), and 4.8 parts of ethyl acetate. The molar ratio of the compound (I) to the compound (IIa) was 6/4. The oily phase was emulsified in an aqueous phase prepared from 95 parts of distilled water and 5 parts of polyvinyl alcohol by means of a homomixer (8000 rpm). The resulting O/W emulsion was charged in a polymerization reactor equipped with a reflux tube, a stirrer, and a dropping funnel.

Separately, 13 parts of an aqueous solution of 3 parts of triethylenetetramine was prepared. The aqueous solution was dropwise added to the emulsion through the dropping funnel, and the system was allowed to polymerize at 70° C. for 3 hours to obtain microcapsules D1 composed of a polyurea outer shell and a triphenylphosphine core. Microcapsules D1 had an average particle size of 2 μm and a shell thickness ratio of 20% based on the particle size. The destruction temperature of the shell was 150° C.

Microcapsules D2:

Microcapsules D2 (average particle size: 2 μm) were prepared in the same manner as for microcapsules D1, except for changing the (I)/(IIa) molar ratio to 7/3. The destruction temperature of the shell was 140° C.

Microcapsules D3:

Microcapsules D3 (average particle size: 2 μm) were prepared in the same manner as for microcapsules D1, except for changing the (I)/(IIa) molar ratio to 10/0. The destruction temperature of the shell was 110° C.

Microcapsules D4:

Microcapsules D4 (average particle size: 2 μm) were prepared in the same manner as for microcapsules D1, except for changing the (I)/(IIa) molar ratio to 5/5. The destruction temperature of the shell was 155° C.

Microcapsules D5:

Microcapsules D5 (average particle size: 2 μm) were prepared in the same manner as for microcapsules D1, except for changing the (I)/(IIa) molar ratio to 3/7. The destruction temperature of the shell was 165° C.

Other compounding components used in Examples and Comparative Examples are shown below.

Epoxy Resin A1:

4,4'-Bis(2,3-epoxypropoxy)-3,3',5,5'-tetramethylbiphenyl (epoxy equivalent: 200)

Epoxy Resin A2:

Cresol novolak epoxy resin (epoxy equivalent: 198)

Phenolic Resin B1:

Phenol aralkyl resin represented by formula (V) wherein n=0 to 21 (hydroxyl equivalent: 175)

Phenolic Resin B2:

Phenol novolak resin (hydroxyl equivalent: 105)

Cure Accelerator C1:

Triphenylphosphine

Cure Accelerator C2:

Tetraphenylphosphonium tetraphenylborate

Cure Accelerator C3:

1,8-Diazabicyclo[5.4.0]undecene-7

Inorganic Filler:

Ground fused silica (average particle size: 15 μm)

Brominated Epoxy Resin:

Epoxy equivalent: 275; bromine content: 36%

EXAMPLES 1 TO 14 AND COMPARATIVE EXAMPLES 1 TO 4

Materials shown in Tables 1 to 3 below were compounded and melt kneaded in a mixing roll. After cooling, the compound was ground to powder to obtain an epoxy resin composition for semiconductor encapsulation.

TABLE 1

| | | | Example No. | | | | | | |
|---|---|---|---|---|---|---|---|---|---|
| | | | 1 | 2 | 3 | 4 | 5 | 6 | 7 |
| Epoxy Resin (A) | | A1 | — | 85 | 85 | 85 | 85 | 85 | 85 |
| | | A2 | 85 | — | — | — | — | — | — |
| Phenol Resin (B) | | B1 | — | 87 | 87 | 87 | 87 | 87 | 87 |
| | | B2 | 52 | — | — | — | — | — | — |
| Cure Accelerator (C) | | C1 | — | — | — | — | — | — | — |
| | | C2 | — | — | — | — | — | — | — |
| | | C3 | 1.4 | 2.5 | 2.5 | 2.5 | 2.5 | 2.5 | 0.2 |
| Cure Accelerator | D1 | 6/4* | — | 10 | — | — | — | — | — |
| Containing | D2 | 7/3* | 5.4 | — | 10 | — | — | — | 16.7 |
| Micro-capsules | D3 | 10/0* | — | — | — | 10 | — | — | — |
| (D) | D4 | 5/5* | — | — | — | — | 10 | — | — |
| | D5 | 3/7* | — | — | — | — | — | 10 | — |
| Inorganic Filler | | | 1460 | 1620 | 1620 | 1620 | 1620 | 1620 | 1620 |
| Polyethylene Wax | | | 3 | 3 | 3 | 3 | 3 | 3 | 3 |
| Brominated Epoxy Resin | | | 20 | 20 | 20 | 20 | 20 | 20 | 20 |
| Antimony Trioxide | | | 20 | 20 | 20 | 20 | 20 | 20 | 20 |
| (C)/(D) Weight Ratio | | | 20/80 | 20/80 | 20/80 | 20/80 | 20/80 | 20/80 | 1/99 |

*(I)/(IIa) Molar ratio

TABLE 2

| | | Example No. | | | | | | |
|---|---|---|---|---|---|---|---|---|
| | | 8 | 9 | 10 | 11 | 12 | 13 | 14 |
| Epoxy Resin (A) | A1 | 85 | 85 | 85 | 85 | 85 | 85 | 85 |
| | A2 | — | — | — | — | — | — | — |
| Phenolic Resin (B) | B1 | 87 | 87 | 87 | 87 | 87 | 87 | 87 |
| | B2 | — | — | — | — | — | — | — |
| Cure Accelerator (C) | C1 | — | — | — | 2.6 | — | — | — |
| | C2 | — | — | — | — | 4.4 | — | — |
| | C3 | 1.3 | 3.1 | 4.0 | — | — | 4.9 | 4.2 |
| Cure Accelerator | D1 | 6/4* | — | — | — | — | — | — | — |
| Containing | D2 | 7/3* | 13 | 7.2 | 4.0 | 2.6 | 4.4 | 0.3 | 1.0 |
| Micro-capsules | D3 | 10/0* | — | — | — | — | — | — | — |
| (D) | D4 | 5/5* | — | — | — | — | — | — | — |
| | D5 | 3/7* | — | — | — | — | — | — | — |
| Inorganic Filler | | 1620 | 1620 | 1620 | 1620 | 1620 | 1620 | 1620 |
| Polyethylene Wax | | 3 | 3 | 3 | 3 | 3 | 3 | 3 |
| Brominated Epoxy Resin | | 20 | 20 | 20 | 20 | 20 | 20 | 20 |
| Antimony Trioxide | | 20 | 20 | 20 | 20 | 20 | 20 | 20 |
| (C)/(D) Weight Ratio | | 10/90 | 30/70 | 50/50 | 50/50 | 50/50 | 95/5 | 80/20 |

*(I)/(IIa) Molar ratio

TABLE 3

| | | Comparative Example No. | | | |
|---|---|---|---|---|---|
| | | 1 | 2 | 3 | 4 |
| Epoxy Resin (A) | A1 | 85 | 85 | 85 | 85 |
| | A2 | — | — | — | — |
| Phenolic Resin (B) | B1 | 87 | 87 | 87 | 87 |
| | B2 | — | — | — | — |
| Cure Accelerator (C) | C1 | 3.9 | — | — | — |
| | C2 | — | — | — | — |
| | C3 | — | 5.2 | — | — |
| Cure Accel- | D1 | 6/4* | — | — | 11 | 15 |
| erator- | D2 | 7/3* | — | — | — | — |
| Containing | D3 | 10/0* | — | — | — | — |
| Micro-capsules | D4 | 5/5* | — | — | — | — |
| (D) | D5 | 3/7* | — | — | — | — |
| Inorganic Filler | | 1620 | 1620 | 1620 | 1620 |
| Polyethylene Wax | | 3 | 3 | 3 | 3 |
| Brominated Epoxy Resin | | 20 | 20 | 20 | 20 |
| Antimony Trioxide | | 20 | 20 | 20 | 20 |
| (C)/(D) Weight Ratio | | 100/0 | 100/0 | 0/100 | 0/100 |

*(I)/(IIa) Molar ratio

The epoxy resin compositions prepared in Examples and Comparative Examples were evaluated as follows. The results obtained are shown in Tables 4 and 5 below.
1) Gel Time at 175° C.
The gel time at 175° C. was measured by a hotbench test.
2) Hardness After Cure (175° C.×50 sec)
The epoxy resin composition was molded at 175° C. for 50 seconds. The hardness of the cured resin while hot was measured with a Shore D hardness tester.
3) Storage Stability
A spiral flow mold preheated to 175° C.±5° C. was dosed, and a clamping pressure was applied. When the clamping pressure reached 210±10 kg/cm², the epoxy resin powder composition was put into the transfer pot and transferred with a plunger. After the transfer force reached 70±5 kg/cm², that pressure was applied for 1 minutes and 50 seconds. After the plunger pressure was relieved, the clamping pressure was released to open the mold. The length of the molded spiral was measured to a precision of 2.5 mm to obtain a spiral flow value (SF value) in accordance with EMMI 1-66, which was taken as an initial SF value.

The same epoxy resin powder composition was preformed into tablets of 24.5 mm in diameter and 20 mm in thickness, and the tablets were allowed to stand at 30° C. for 3 days. The resulting tablets were tested in the same manner as described above to obtain a post-storage SF value. A spiral flow retention (%) was calculated from the initial and post-storage SF values according to equation:

Spiral flow retention (%)=(post-storage SF value)/(initial SF value)×100

4) Moldability and Reliability

The epoxy resin powder composition was preformed into tablets of 24.5 mm in diameter and 20 mm in thickness, and the tablets were allowed to stand at 30° C. for 3 days. The tablets were transfer molded on semiconductor elements at 175° C. for 90 seconds to obtain semiconductor devices having the following specification:

80-Pin quadruple flat package (QFP-80): 14 mm×8 mm×2.7 mm (t)

Lead frame: MF202

Semiconductor element: 8 mm×8 mm×0.37 mm (thickness)

Out of 120 semiconductor devices thus obtained, the number of those which had molding faults was counted. That is, semiconductor packages (QFP-80; 14 mm×20 mm×2.7 mm) were made in 10 shots by automatic molding equipment (VPS-40, manufactured by TOWA) and inspected for development of non-filing and voids. The semiconductor devices suffering from voids of 0.1 mm or greater in diameter as measured with a soft X-ray apparatus were rejected as defectives. Further, the devices under test were left to stand in a pressure cooker kept at 121° C., 2 atm., and 100% RH (pressure cooker test, hereinafter abbreviated as PCT). When electricity was passed through the devices, those suffering from a short-circuit were rejected as defectives. The PCT testing time at which the rejection rate reached 50% was measured.

TABLE 4

| Example No. | Characteristics of Composition | | | Molding Properties | | Reliability in |
|---|---|---|---|---|---|---|
| | Gel Time at 175° C. (sec) | Shore D Hardness (175° C. × 50 sec) | Storage Stability (%) | Rejection Rate due to Non-filling (%) | Rejection Rate due to Void Formation (%) | PCT (50% Rejection Time) |
| 1 | 17 | 75 | 88 | 0 | 2 | 260 |
| 2 | 20 | 73 | 81 | 0 | 4 | 320 |
| 3 | 21 | 73 | 82 | 0 | 6 | 290 |
| 4 | 18 | 76 | 78 | 0 | 4 | 300 |
| 5 | 25 | 72 | 82 | 0 | 4 | 330 |
| 6 | 27 | 71 | 84 | 0 | 3 | 310 |
| 7 | 30 | 70 | 97 | 0 | 3 | 280 |
| 8 | 27 | 71 | 92 | 0 | 4 | 290 |
| 9 | 24 | 74 | 84 | 0 | 6 | 310 |
| 10 | 21 | 75 | 81 | 0 | 3 | 330 |
| 11 | 22 | 77 | 80 | 0 | 6 | 300 |
| 12 | 23 | 76 | 82 | 0 | 5 | 360 |
| 13 | 15 | 81 | 70 | 0 | 2 | 240 |
| 14 | 17 | 80 | 71 | 0 | 2 | 250 |

TABLE 5

| Comparative Example No. | Characteristics of Composition | | | Molding Properties | | Reliability in |
|---|---|---|---|---|---|---|
| | Gel Time at 175° C. (sec) | Shore D Hardness (175° C. × 50 sec) | Storage Stability (%) | Rejection Rate due to Non-filling (%) | Rejection Rate due to Void Formation (%) | PCT (50% Rejection Time) |
| 1 | 16 | 75 | 66 | 17 | 388 | 60 |
| 2 | 14 | 83 | 52 | 27 | 322 | 70 |
| 3 | 40 | 61 | 99 | 0 | 13 | 160 |
| 4 | 33 | 66 | 99 | 0 | 9 | 170 |

As can be seen from the results in Tables 4, all the compositions prepared in Examples 1 to 14 had high hardness (Shore D) and a high spiral flow retention, proving excellent in curability and storage stability. In a molding test, they suffered no non-filling and had an extremely low rate of void development. Further, they showed satisfactory moisture resistance in PCT. These results apparently verify that the epoxy resin compositions according to the invention have high storage stability and excellent rapid curability and are therefore suited for use as a highly reliable encapsulating material for semiconductor elements.

To the contrary, the compositions of Comparative Examples 1 and 2 had a low spiral flow retention, which indicates poor storage stability. On account of this, occurrence of non-filing and frequent occurrence of voids were observed, and the results of PCT were poor. The compositions of Comparative Examples 3 and 4, while superior in spiral flow retention, had low curability in short cure time molding and showed poor results in PCT.

The epoxy resin composition according to the invention which comprises (A) an epoxy resin, (B) a phenolic resin, and, for cure acceleration, a combination of (C) a cure accelerator and (D) a cure accelerator-containing microcapsules is excellent in both rapid curability and storage stability. In a preferred embodiment, the mixing ratio of components (C) and (D) is specified to secure further improvements on curability and storage stability.

In another preferred embodiment, the shell of the cure accelerator-containing microcapsules comprises polyurea prepared by using specific triisocyanate compounds at a specific mixing ratio. According to this embodiment, it is possible to melt-knead the microcapsules with other components at high temperatures around 130° C. This means that the kneading system can have a reduced viscosity, which is advantageous for thorough kneading, to give an epoxy resin composition having the components dispersed uniformly.

In a preferred embodiment, a biphenyl type epoxy resin is used as component (A) to secure improved flowability, i.e., improved moldability, as a whole. Use of the phenol aralkyl resin additionally produces the effect that a cured product of the composition has reduced hygroscopicity and reduced elastic modulus which are advantageous for soldering resistance and the like.

Hence, the epoxy resin composition of the invention is most suited as a encapsulating material for semiconductor elements. Additionally, the composition is also useful as well in other fields, such as the fields of adhesives and coatings.

What is claimed is:

1. An epoxy resin composition for semiconductor encapsulation, which comprises (A) an epoxy resin, (B) a phenolic resin, (C) a cure accelerator, and (D) cure accelerator-containing microcapsules having a core/shell structure in which a cure accelerator as a core is encapsulated in a shell comprising a thermoplastic resin.

2. An epoxy resin composition according to claim 1, wherein the mixing ratio of said cure accelerator as component (C) to said cure accelerator-containing microcapsules as component (D) ranges from 95/5 to 1/99 by weight.

3. An epoxy resin composition according to claim 1, wherein said thermoplastic resin is polyurea prepared from a triisocyanate compound represented by formula (I) and a triisocyanate compound represented by formula (II):

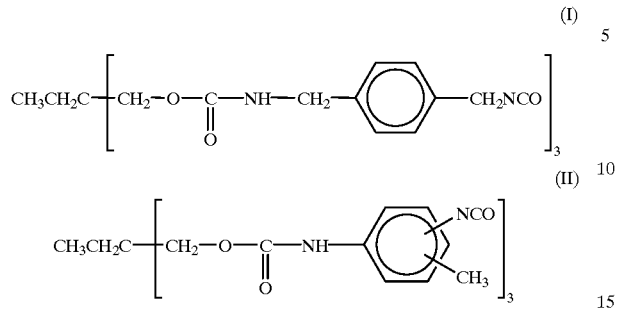

at a compound of formula (I) to compound of formula (II) molar ratio of 100/0 to 30/70.

4. An epoxy resin composition according to claim 1, wherein said epoxy resin as component (A) is a biphenyl type epoxy resin.

5. An epoxy resin composition according to claim 1, wherein said phenolic resin as component (B) is a phenol aralkyl resin.

6. An epoxy resin composition according to claim 3, wherein said polyurea mainly comprises a repeating unit represented by formula (III):

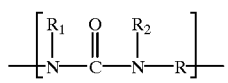

wherein R represents a divalent organic group; and $R_1$ and $R_2$, which may be the same or different, each represent a hydrogen atom or a monovalent organic group.

7. A semiconductor device comprising a semiconductor element encapsulated with an epoxy resin composition, wherein said epoxy resin composition comprises (A) an epoxy resin, (B) a phenolic resin, (C) a cure accelerator, and (D) cure accelerator-containing microcapsules having a core/shell structure in which a cure accelerator as a core is encapsulated in a shell comprising a thermoplastic resin.

8. The semiconductor device according to claim 7, wherein the mixing ratio of said cure accelerator as component (C) to said cure accelerator-containing microcapsules as component (D) ranges from 95/5 to 1/99 by weight.

9. The semiconductor device according to claim 7, wherein said thermoplastic resin is polyurea prepared from a triisocyanate compound represented by formula (I) and a triisocyanate compound represented by formula (II):

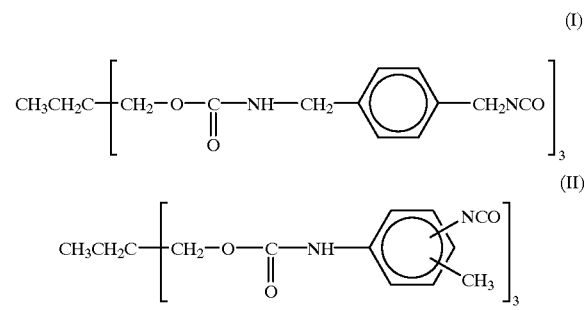

at a compound of formula (I) to compound of formula (II) molar ratio of 100/0 to 30/70.

10. The semiconductor device according to claim 7, wherein said epoxy resin as component (A) is a biphenyl type epoxy resin.

11. The semiconductor device according to claim 7, wherein said phenolic resin as component (B) is a phenol aralkyl resin.

12. The semiconductor device according to claim 9, wherein said polyurea mainly comprises a repeating unit represented by formula (III):

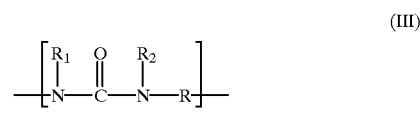

wherein R represents a divalent organic group; and $R_1$ and $R_2$, which may be the same or different, each represent a hydrogen atom or a monovalent organic group.

* * * * *